United States Patent [19]

Napoli et al.

[11] 3,856,591

[45] Dec. 24, 1974

[54] METHOD FOR MAKING BEAM LEAD DEVICE

[75] Inventors: Louis Sebastian Napoli, Hamilton Square; John Joseph Hughes, Spotswood, both of N.J.

[73] Assignee: RCA Corporation, New York, N.Y.

[22] Filed: June 25, 1973

[21] Appl. No.: 373,600

Related U.S. Application Data

[62] Division of Ser. No. 314,089, Dec. 11, 1972, abandoned.

[52] U.S. Cl. .......... 156/3, 156/7, 156/17, 317/234

[51] Int. Cl. .......... H01l 7/50

[58] Field of Search .......... 156/3, 7, 13, 17; 29/576, 29/589; 317/234

[56] References Cited

UNITED STATES PATENTS

| | | | |
|---|---|---|---|
| 3,456,334 | 7/1969 | Baker et al. | 29/577 |
| 3,556,951 | 1/1971 | Cerniglia et al. | 156/17 |
| 3,615,949 | 10/1971 | Hicks | 156/3 |

*Primary Examiner*—William A. Powell
*Attorney, Agent, or Firm*—Edward J. Norton; Joseph D. Lazar; Donald E. Mahoney

[57] ABSTRACT

A beam lead device which can be made extremely thin and with an extremely narrow cross sectional area is presented. The beam lead device has elongated metal contacts on its top and bottom surfaces which overhang the surfaces and which are angularly disposed from one another so as to form an X.

Also presented is the method for making such a beam lead device which includes the steps of preparing an appropriately-doped piece of semiconductor material, depositing elongated metal contacts upon the top and bottom surfaces of the semiconductor material, and then etching through the semiconductor material with its portions of the top and bottom contacts which intersect one another acting as a mask and protecting the semiconductor device during the etching procedure. The disclosed method of forming a beam lead device eliminates critical alignment of masks and also provides a simplified method of making such a device.

6 Claims, 9 Drawing Figures

PATENTED DEC 24 1974 3,856,591

METHOD FOR MAKING BEAM LEAD DEVICE

This is a continuation, division, of application Ser. No. 314,089, filed Dec. 11, 1972, now abandoned.

BACKGROUND OF THE INVENTION

This invention relates to beam lead devices and to a method for making the same. More particularly, this invention relates to beam lead diodes for microwave and millimeter wavelength frequencies and to a method for making such diodes.

Diodes which are used for high frequency applications should have a very low junction capacitance. Therefore, diodes which are used for such applications are preferably made with very small, e.g., 2–12 microns, diameters in order to provide for small junction capacitance. The small size of such diodes has created a problem with respect to handling the diode and to electrically connecting it to the outside world. One solution to this problem has been to make so-called "beam lead" devices. A beam lead device is a semiconductor device which has had a metallic layer deposited upon the semiconductor material during the fabrication of the device. This metallic layer constitutes a means for supporting the device and for providing electrical contact to the device.

In the past, one problem encountered with beam lead devices has been in aligning the masks to be used in the deposition of the metallic layer which constitute the beam lead contact. Heretofore, this alignment procedure has been critical due to the small size of the devices being used and to the manner in which prior beam lead devices were made.

SUMMARY OF THE INVENTION

A semiconductor device is presented which comprises at least one layer of semiconductor material having a top surface and a bottom surface; a first elongated metal contact attached to the top surface of the semiconductor material, the first elongated metal contact having two ends, each of which extend beyond the top surface of the semiconductor material; and a second elongated metal contact attached to the bottom surface of the semiconductor material, the second elongated metal contact having two ends, both of which extend beyond the bottom surface of the semiconductor material, the second elongated metal contact being angularly disposed to the first elongated metal contact and crossing the first elongated metal contact with the semiconductor material therebetween at the point of crossing.

Also presented is a method for making a semiconductor device which comprises the steps of providing an appropriately-doped piece of semiconductor material having a first side and a second side; depositing a first set of elongated metal contacts upon the first side of the semiconductor material; depositing a second set of elongated metal contacts upon the second side of the semiconductor material, the second set of elongated metal contacts crossing the first set of elongated metal contacts; and etching the semiconductor material thereby removing all of the semiconductor material other than that which is disposed between the first set and the second set of elongated metal contacts.

DESCRIPTION OF THE PREFERRED EMBODIMENTS

Figure 1:
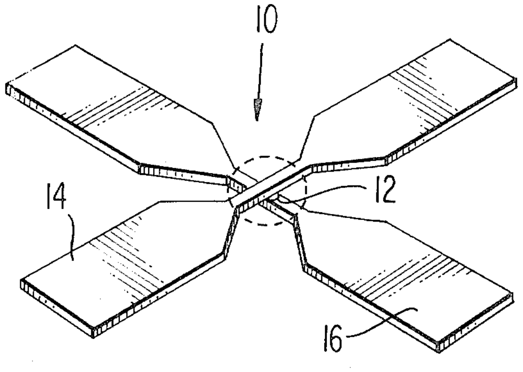
FIG. 1 is a perspective view of one embodiment of the beam lead diode of the present invention.
Figure 1A:
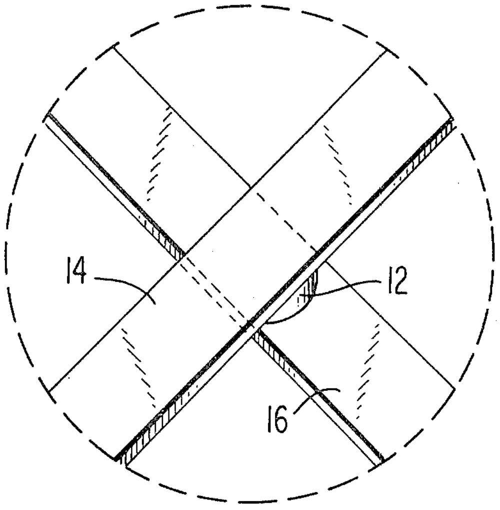
FIG. 1*a* is an enlarged view of one section of FIG. 1.

Referring generally to FIG. 1, a beam lead diode 10 made by the method of the present invention is shown. The diode 10 comprises a semiconductor device 12 and substantially perpendicularly disposed elongated metal contacts 14, 16 which are mounted on either side of, and electrically connected to, the semiconductor device 12. The elongated contacts 14, 16 may be of uniform width, but in the preferred embodiment they are shown to be substantially shaped like bowties in order to provide a structure which is relatively thick at the ends for support and which is relatively thin in the middle so that the device 12 will be formed with a very narrow diameter. The central portion of FIG. 1 is shown enlarged in FIG. 1*a* in order to more clearly show the relationship which exists between the semiconductor device 12 and the contacts 14, 16.

Figure 2:
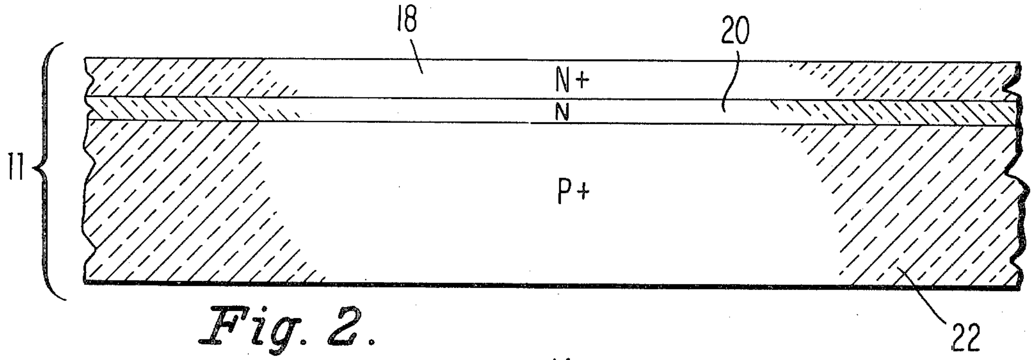
FIG. 2 is a sectional view of a semiconductor wafer having doped semiconductor layers therein.

Referring generally to FIG. 2, a wafer of semiconductor material 11 comprising an N+ layer 18 having a thickness of about 0.8$\mu$m, a P+ layer 22, having a thickness of about 75$\mu$m, and an N layer 20 having a thickness of about 0.2$\mu$m sandwiched between the N+ layer 18 and the P+ layer 22, is shown. The wafer 11 shown in FIG. 2 will be used to construct the diode 10 of FIG. 1. In the preferred embodiment of the diode 10, the semiconductor used is a III–V compound, gallium arsenide (GaAs), but other semiconductor materials such as II-VI compounds, silicon, or germanium can be used without departing from the disclosed invention. While the diode 10 of FIG. 1 is a Schottky-barrier diode, the present invention is not limited to the fabrication of such diodes and may be used to construct other types of diodes and semiconductor devices by suitably doping the wafer 11. The P+ layer 22 will not be used in the finished diode 10, but it is needed to provide a "handle" and to give the wafer 11 support during the fabrication of the diode 10.

Figure 3:
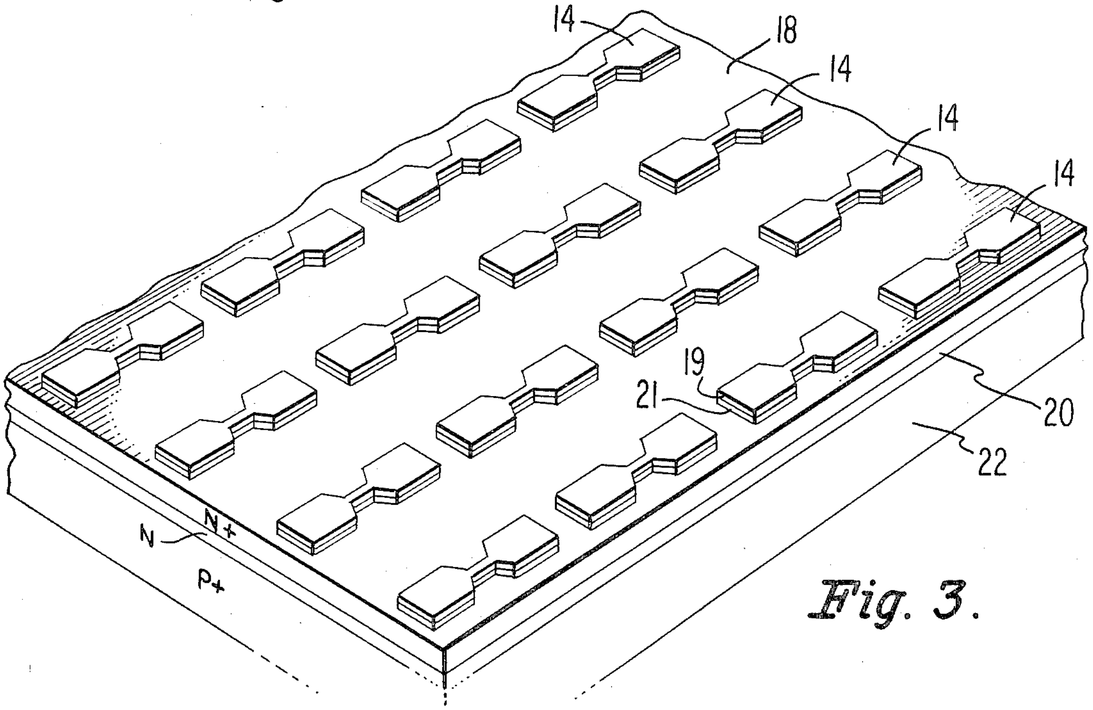
FIG. 3 is a perspective view of the doped semiconductor wafer of FIG. 2 following the deposition and definition of metallic contacts.

Referring generally to FIG. 3, a set of contacts 14 are deposited and defined upon the N+ layer 18. The deposition of the contacts 14 is accomplished by first evaporating an adherence layer 21 such as titanium upon the N+ layer 18. A layer 19 of a conductive metal such as gold or silver is then deposited over the adherence layer 21. In the preferred embodiment, titanium is used for the adherence layer 21 and gold is used for the conductive layer 19. The gold layer 19 may be deposited either by evaporating gold onto the titanium layer 21 in a vacuum chamber or by electroplating the gold layer 19 onto the titanium layer 21. Following the deposition of the gold layer 19, the contacts 14 are defined on the gold layer 19 with photoresist material using standard photolithographic techniques. The area of the metallic layers 19, 21 which is not protected by the photoresist material is then etched away and the photoresist material on the contacts 14 is removed in a suitable solvent.

Figure 4:
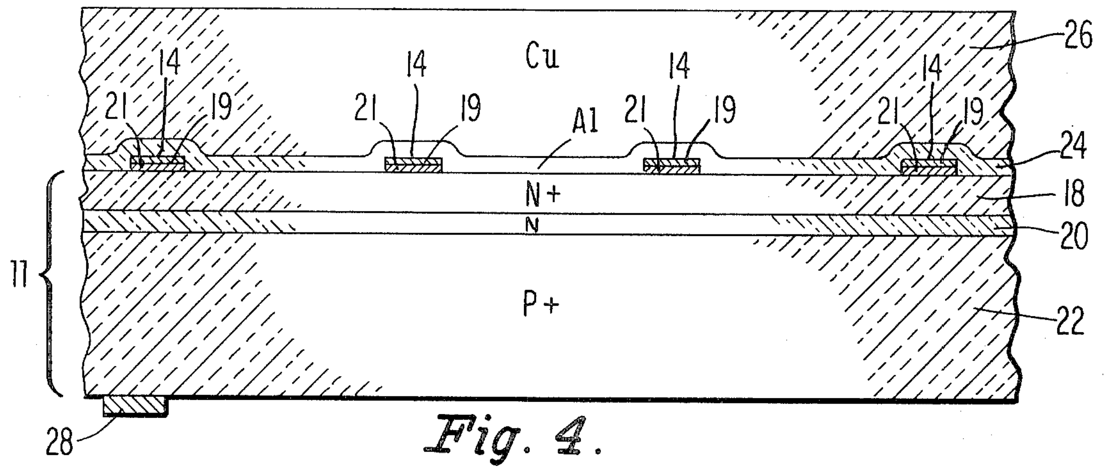
FIG. 4 is a sectional view of the doped semiconductor wafer of FIG. 2 following the deposition and definition of metallic contacts, protective, and handling layers.

It is necessary to protect the contacts 14 and to provide a new "handle" so that the preparation of the lower portion of the diode 10 may be accomplished. A protective aluminum layer 24, as shown in FIG. 4, is deposited upon the N+ layer 18 covering the N+ layer 18 and the contacts 14. The thickness of the aluminum layer 24 is not important as the layer 24 serves only to isolate and protect the N+ layer 18 and the contacts 14. The deposition of the aluminum layer 24 may be accomplished by the vacuum evaporation of aluminum. A relatively thick copper layer 26 which may be used as the new "handle" during the fabrication of the diode 10 is deposited upon the aluminum layer 24. The deposition of the copper layer 26 may be by any commonly-known method such as by vacuum evaporation.

Figure 5:
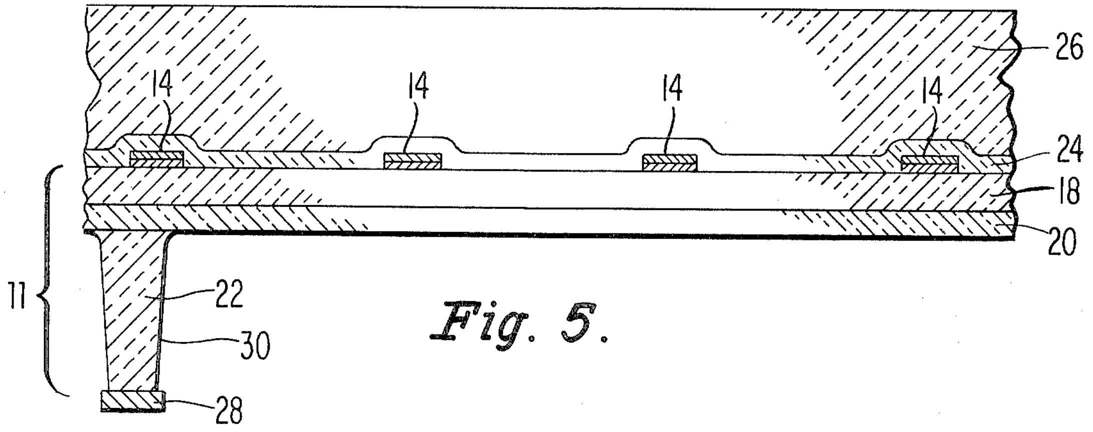
FIG. 5 is a sectional view of the partially prepared material of FIG. 4 following the removal of the P+ substrate portion of the semiconductor.

With the addition of the copper layer 26, the P+ layer 22 is no longer necessary and must be removed in order to prepare the bottom surface of the wafer 11. A metal contact 28 is deposited upon the P+ layer 22. By applying a voltage between the contact 28 and the copper layer 26, as per the method described by C. Nuese and J. J. Gannon in their article entitled "Electrolytic Removal of P Type GaAs Substrates From Thin N-Type Semiconductor Layers," *JOURNAL OF THE ELECTROCHEMICAL SOCIETY*, Vol. 117, p. 1094–1097, 1970, which further entails putting the wafer 11 into a sodium peroxide solution, the P+ layer 22 will be electrolytically etched away until the N layer 20 is exposed, as shown in FIG. 5. A mesa 30 of P+ material having the contact 28 at its end will remain following the electrolytic etch.

Figure 6:
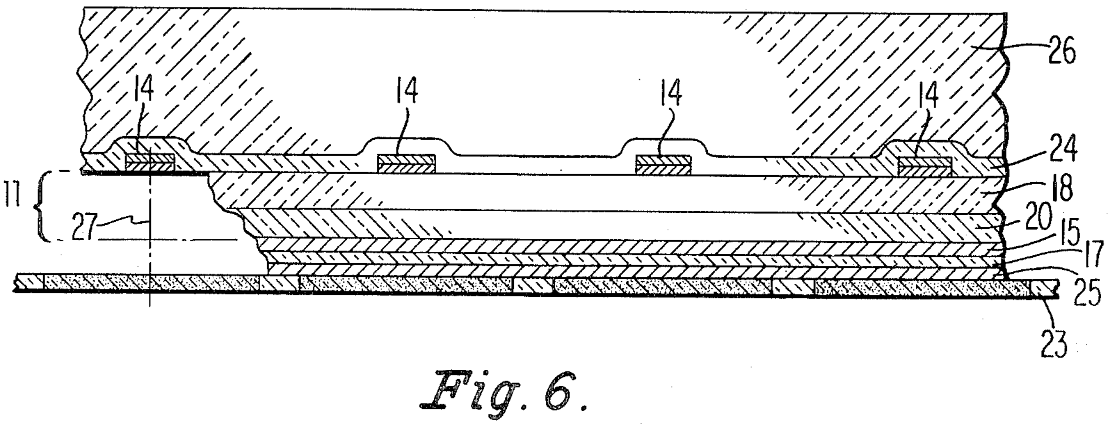
FIG. 6 is a sectional view of the material of FIG. 5 following the deposition of metallic contact layers and prior to the exposure and development of the photoresist material.
Figure 7:
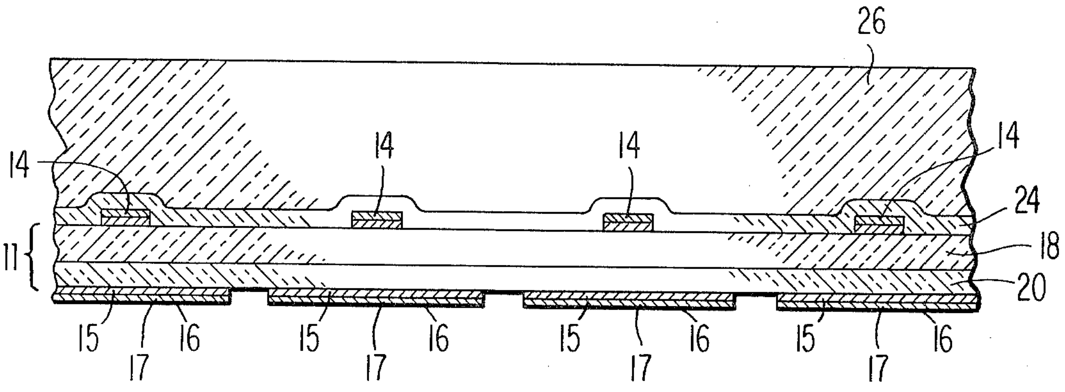
FIG. 7 is a sectional view of the material of FIG. 6 prior to removal of the metallic protective and handling layers.

Referring generally to FIGS. 6 and 7, a pattern of contacts 16 is deposited and defined upon the N-type layer 20. These contacts 16 are comprised of titanium and gold layers 15, 17 with the titanium layer 15 being used as an adherence layer to the N-type gallium arsenide layer 20 and forming a Schottky barrier to layer 20. The gold layer 17 is used to provide good electrical contact to the diode 10. The deposition of the contacts 16 may be accomplished by first depositing a titanium layer 15 upon the N-type layer 20. The deposition may be accomplished by vacuum evaporation of titanium. A gold layer 17 is then deposited upon the titanium layer 15 with the deposition of the gold layer 17 accomplished either by vacuum evaporation or by electroplating. A portion of the N, N+, titanium, and gold layers 20, 18, 15, 17, is removed from one end of the wafer 11 in order to expose some of the contacts 14 which are embedded in the aluminum protective layer 24. Next, a light sensitive layer 25 of a photoresist material is coated upon the gold layer 17. A mask 23 is then placed on the light sensitive layer 25 and is aligned perpendicularly over the exposed contacts 14. This is accomplished by sighting an exposed contact 14 through the mask 23 along a line 27. This will ensure that the contacts 16 will be in proper alignment and substantially perpendicular to the unexposed contacts 14 which were previously deposited upon the N+ layer 18 and that these contacts 16 will cross the previously deposited contacts 14. The photoresist material 25 is sensitized by light shown through the mask 23. Using standard photolithographic techniques the sensitized regions of the photoresist layer 25 are removed leaving a set of contacts 16 covered by photoresist material 25 which is now removed in a suitable solvent.

Once the lower set of contacts 16 have been deposited, it is no longer necessary to have a "handle" to use in the fabrication of the diode 10. Therefore, the thick copper layer 26 which was previously deposited is removed. This may be accomplished by etching in any solution which will etch copper but which will not affect aluminum, such as a solution of aluminum persulfide and mercuric sulfide. This etch is continued until all of the copper layer 26 has been removed.

Figure 8:
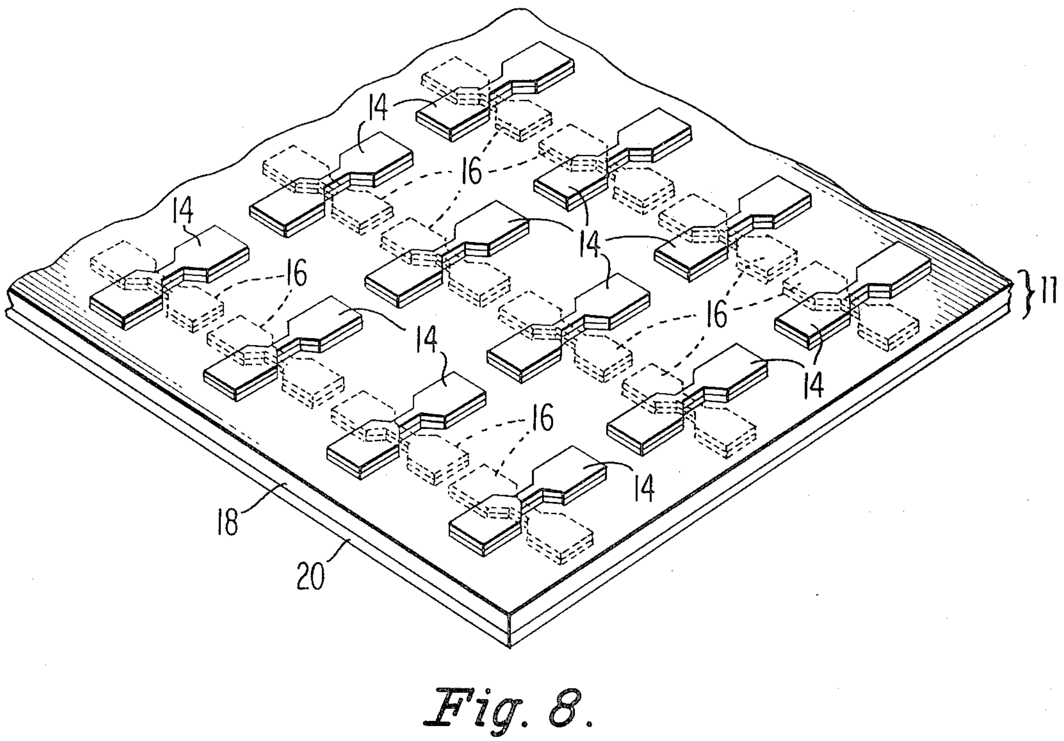
FIG. 8 is a perspective view of the fully prepared wafer prior to separation into discrete devices.

Following the removal of the copper layer 26, the aluminum protective layer 24 is removed. The removal of the aluminum layer 24 may be accomplished by etching in any solution which will etch aluminum without affecting either gold, titanium, or GaAs. A typical example would be a solution of Photoengraver's iron chloride. Following the removal of the aluminum layer 24, a thin wafer 11 having upper and lower sets of contacts 14, 16 will remain as shown in FIG. 8. This wafer 11 is now etched in Caro's acid. When the etching is completed, the process is preferably quenched by the addition of large quantities of water in order to ensure that the etching process stops. The common region where the upper contacts 14 and the lower contacts 16 cross will be masked and protected by these contacts 14, 16. This region will be undercut by the etching process which tends to undercut substantially as far as it etches into the wafer 11, but due to the thin nature of the N and N+ layers 20, 18, this region will not be etched away. In the completed diode 10, the region between the contacts 14, 16 comprises the semiconductor device 12. As a result of the etching processes, and the final etch in the Caro's acid, discrete diodes 10 as shown in FIG. 1 will be separated from the wafer 11 and will constitute the final devices.

I claim:

1. The method of making a semiconductor device comprising the steps of:

a. providing an appropriately doped piece of semiconductor material having a first side and a second side;

b. depositing a first set of elongated metal contacts upon said first side of said semiconductor material;

c. depositing a second set of elongated metal contacts upon said second side of said semiconductor material, said second set of elongated metal contacts crossing said first set of elongated metal contacts; and d. etching said semiconductor material thereby removing all of said semiconductor material other than that which is disposed between said first set and said second set of elongated metal contacts.

2. The method of claim 1 comprising the additional steps of depositing a protective layer over said first set of elongated metal contacts following said step of depositing said first set of elongated metal contacts and etching away said protective layer prior to said step of etching said semiconductor material and thereby removing all of said semiconductor material other than that which is disposed between said first set and said second set of elongated metal contacts.

3. The method of claim 2 wherein said protective layer comprises a metallic layer which is approximately the same thickness as the thickness of said elongated metal contacts and consists of a metal of a type different from that used in said elongated metal contact.

4. The method of claim 3 comprising the additional steps of depositing a handle material onto said protective material, said handle material being thick relative to said protective material and consisting of a different type of material than said handle material and removing said handle material prior to the step of removing said protective material.

5. The method of claim 4 wherein said handle material consists of copper and said protective material consists of aluminum.

6. The method of claim 2 wherein the aluminum of said second set of elongated metal contacts relative to said first set of elongated metal contacts is accomplished by the additional step of etching away a portion of said semiconductor material to expose some of the members of the first set of elongated metal contacts embedded within said protective material and aligning a mask over said exposed members of said first set of elongated metal contacts whereby the mask will be aligned over the unexposed members of said first set of elongated metal contacts.

* * * * *

UNITED STATES PATENT OFFICE
CERTIFICATE OF CORRECTION

Patent No. 3,856,591 Dated December 24, 1974

Inventor(s) Louis Sebastian Napoli et al

It is certified that error appears in the above-identified patent and that said Letters Patent are hereby corrected as shown below:

Column 1, line 2, delete "continuation"

Signed and sealed this 4th day of March 1975.

(SEAL)
Attest:

RUTH C. MASON
Attesting Officer

C. MARSHALL DANN
Commissioner of Patents
and Trademarks